(12) United States Patent
Liu et al.

(10) Patent No.: US 6,380,095 B1
(45) Date of Patent: Apr. 30, 2002

(54) SILICON TRENCH ETCH USING SILICON-CONTAINING PRECURSORS TO REDUCE OR AVOID MASK EROSION

(75) Inventors: Wei Liu, Sunnyvale; Yiqiong Wang, Morgan Hill; Maocheng Li, Fremont; Anisul Khan, Sunnyvale; Shaoher Pan, San Jose; Dragan Podlesnik, Palo Alto, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/716,074

(22) Filed: Nov. 16, 2000

Related U.S. Application Data

(63) Continuation of application No. 09/102,527, filed on Jun. 22, 1998, now abandoned.

(51) Int. Cl.[7] .............................................. H01L 21/302
(52) U.S. Cl. ...................... 438/719; 438/700; 438/701; 438/710; 438/711
(58) Field of Search ................................ 438/700, 701, 438/695, 710, 711, 714, 719, 733

(56) References Cited

U.S. PATENT DOCUMENTS

| | | | |
|---|---|---|---|
| 4,784,720 A | 11/1988 | Douglas | 438/695 |
| 4,977,104 A | 12/1990 | Sawada et al. | 438/386 |
| 4,984,039 A | 1/1991 | Douglas | 357/236 |
| 5,100,505 A | 3/1992 | Cathey, Jr. | 438/695 |
| 5,182,234 A | 1/1993 | Meyer | 437/233 |
| 5,229,315 A | 7/1993 | Jun et al. | 437/67 |
| 5,298,790 A | 3/1994 | Harmon et al. | 257/622 |
| 5,318,665 A | 6/1994 | Oikawa | 156/643 |
| 5,342,481 A | 8/1994 | Kadomura | 156/659.1 |
| 5,368,686 A | 11/1994 | Tatsumi et al. | 156/656 |
| 5,370,768 A | 12/1994 | Mersereau et al. | 216/26 |
| 5,423,941 A | 6/1995 | Komura et al. | 156/643.1 |
| 5,458,734 A | 10/1995 | Tsukamoto | 438/701 |
| 5,491,112 A | 2/1996 | Buchta et al. | 438/694 |
| 5,522,966 A | 6/1996 | Komura et al. | 438/701 |
| 5,605,603 A | 2/1997 | Grimard et al. | 438/715 |
| 5,656,535 A | 8/1997 | Ho et al. | 438/386 |
| 5,756,400 A * | 5/1998 | Ye et al. | 438/710 |
| 6,127,278 A * | 10/2000 | Wang et al. | 438/719 |
| 6,303,513 B1 * | 10/2001 | Khan et al. | 438/714 |
| 6,318,384 B1 * | 11/2001 | Khan et al. | 134/22.1 |

FOREIGN PATENT DOCUMENTS

| | | | |
|---|---|---|---|
| EP | 0272143 | 6/1988 | H01L/21/306 |
| EP | 0283306 | 9/1988 | H01L/21/31 |
| EP | 0565212 | 10/1993 | H01L/21/306 |
| EP | 0732728 | 9/1996 | H01J/21/00 |
| EP | 0814500 | 12/1997 | H01L/21/321 |
| EP | 0821409 | 1/1998 | H01L/21/8242 |
| EP | 0822593 | 2/1998 | H01L/21/8242 |

OTHER PUBLICATIONS

"Aggressive Endpoint Overetch with Maximum Selectivity to Underlayer", IBM Technical Disclosure Bulletin, 1992, vol. No. 35, pp. 17–20.*

Mansano et al. "Deep Trench Etching in Silicon with Fluorine Containing Plasmas", Applied Surface Science, 1996, pp. 583–586.*

Jansen et al. "The Black Silicon Method II: The Effect of Mask Material and Loading on the Reactive Ion Etching of Deep Silicon Trenches", Microelectronic Engineering, 1995, pp. 475–480.*

Geun–Young et al., "Polysilicon etchback plasma process using HBr, $Cl_2$, and $SF_6$ gas mixtures for deep–trench isolation", *J. Electrochem. Soc.*, vol. 139, No. 2, pp. 575–579 (Feb. 1992).

U.S. application No. 08/985,771, Yiqiong Wong et al., filed Dec. 5, 1997.

* cited by examiner

Primary Examiner—Carl Whitehead, Jr.
Assistant Examiner—Maria Guerrero
(74) Attorney, Agent, or Firm—Shirley L. Church; Kathi Bean; Joseph Bach

(57) ABSTRACT

The present invention pertains to an etch chemistry and method useful for the etching of silicon surfaces. The method is particularly useful in the deep trench etching of silicon where profile control is important. In the case of deep trench etching, at least a portion of the substrate toward the bottom of the trench is etched using a combination of reactive gases including a fluorine-containing compound which does not contain silicon (FC); a silicon-containing compound (SC) which does not contain fluorine; and oxygen ($O_2$).

21 Claims, 3 Drawing Sheets

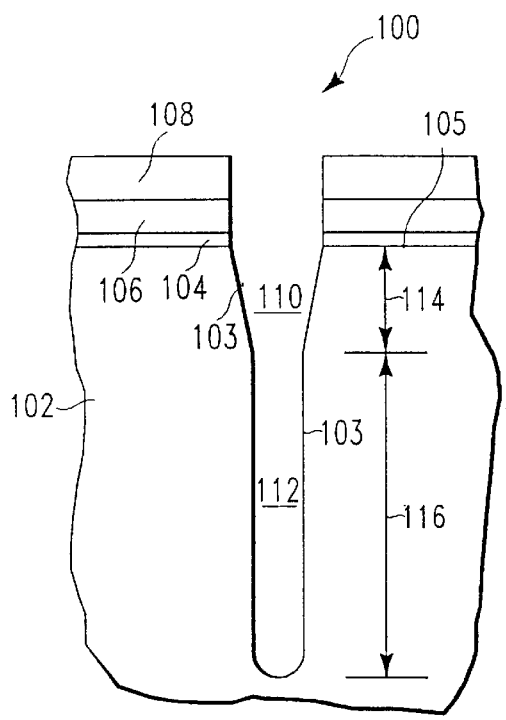
FIG. 1 (PRIOR ART STANDARD)
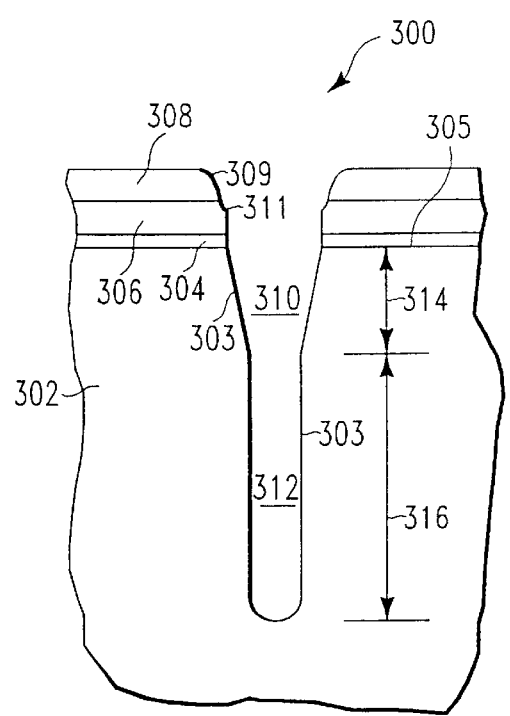
FIG. 3 (PRIOR ART)
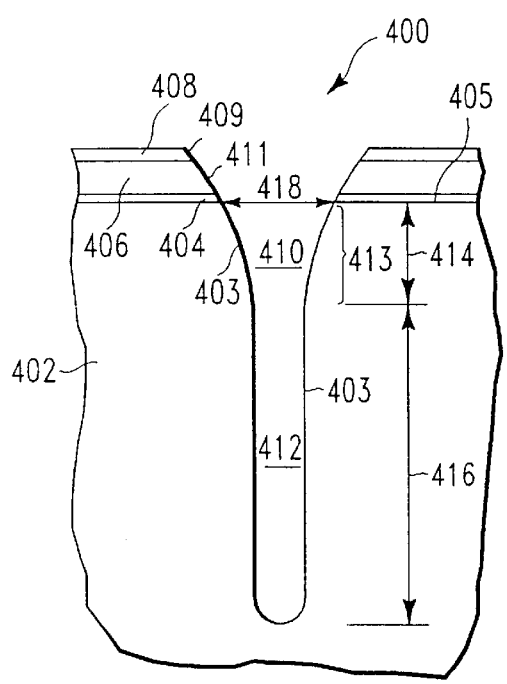
FIG. 4 (PRIOR ART)
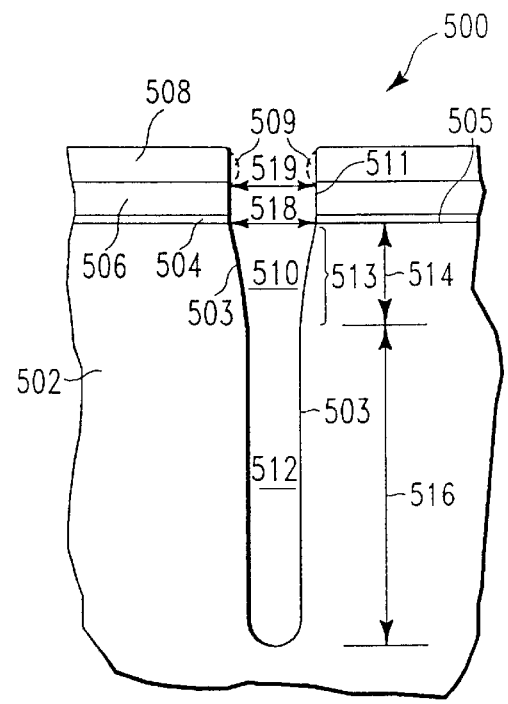
FIG. 5

SILICON TRENCH ETCH USING SILICON-CONTAINING PRECURSORS TO REDUCE OR AVOID MASK EROSION

This application is a continuation application of application Ser. No. 09/102,527, filed Jun. 22, 1998, which is abandoned.

BACKGROUND OF THE INVENTION

1. Field of the Invention

The present invention pertains to the plasma etching of silicon substrates. The method of the invention is generally applicable to the etching of silicon, but is particularly useful in the etching of deep trenches. A typical deep trench would have a diameter of about 0.15 μm (or larger) and an aspect ratio as high as about 35:1. Silicon deep trench etching is most commonly used in capacitor technology and in particular in DRAM applications. Other potential applications for the present etching method include the etching of shallow trenches (currently having a typical feature size of about 0.25 μm to about 0.4 μm and an aspect ratio of about 1.1 to 2:1) used in applications such as device isolation; the etching of polysilicon gates; and, the etching of silicide layers. In addition, the present etching method is useful for the micro machining of silicon surfaces for biomedical applications, for example. The present method of plasma etching may be used in combination with dielectric, photoresist, and metal masking materials

2. Brief Description of the Background Art

Although the silicon etching method of the present invention is useful in a number of applications, as mentioned above, one of the most important applications is the etching of high aspect ratio (over about 20:1) trench capacitors used in DRAM applications. The profile of the etched trench must meet strictly defined industry standards. The current specification for a 256 Mb DRAM capacitor having a critical diameter ranging from about 0.15 to about 0.38 μm calls for strict profile taper control. A schematic showing a representative trench structure 100 is presented in FIG. 1. Trench structure 100 includes a silicon substrate 102, a dielectric pad oxide layer 104, a masking layer 106, and a patterning layer 108. Typically the dielectric pad oxide layer silicon dioxide, the masking layer is silicon nitride, and the patterning layer material is borosilicate glass (BSG) or a silicon oxide generated using tetraethyl orthosilicate (TEOS), or a combination thereof. In some applications, a dielectric Anti-Reflective Compound (ARC) layer such as siliconoxynitride may be used in combination with the patterning layer. The top portion 110 of the trench 103, which extends from the silicon surface 105 into the silicon substrate 102 a depth 114 of about 1.5 μm is specified to taper at an angle of 88.5±0.5°. In general, it is preferred that the angle range from about 87° to about 89°. If the taper were lower, at an angle of 85°, for example, when the critical diameter of the trench is particularly small, for example 0.18 μm, the opening can be closed off completely if the etch varies during processing. The bottom portion 112 of the trench 103, which extends beneath the top portion 110 for an additional depth 116 of about 6.5 μm is specified to taper at an angle of 89.5±0.5°. The bottom of the trench is preferably rounded, and this rounding occurs naturally when the process parameters are as described in the process of the present invention. The bottom portion 112 of the trench may be bottle shaped rather than tapered, as shown in FIG. 7.

The development of manufacturing technology for fabrication of the trench structure shown in FIG. 1 (and for silicon trench structures of the future) depends on development of a plasma etch technology which provides adequate selectivity for the silicon substrate over the patterning layer 108, the masking layer 106, and the dielectric layer 104, while providing an economically feasible etch rate for the silicon substrate layer 102, and, while enabling the profile control necessary to provide the tapers specified above. The plasma etch technology involves a number of materials and process variables.

Related U.S. patent application, Ser. No. 08/985,771, filed Dec. 5, 1997, assigned to the assignee of the present invention and hereby incorporated by reference in its entirety, describes a method for etching high aspect ratio trenches in silicon using a sequential, multistep etch. The plasma source gas composition for the first etch step includes HBr and $O_2$ and may include a non-reactive nobel gas such as helium or argon. The plasma source gas composition for the second etch step includes a fluorine-containing gas, HBr and $O_2$. Examples of gases which may be used to provide a source of fluorine in the second step include $SiF_4$, $Si_2F_6$, $NF_3$, or $SF_6$, with $SF_6$ being preferred. The first etch step is designed to provide passivation of the sidewalls, protecting the hardmask used for patterning the silicon and maintaining the desired, somewhat tapered, shape of the top of the patterned openings. The second step provides an anisotropic etch at high etch rates. The second etch step is also said to remove passivation material from the trench sidewalls, the etching substrate, and the chamber walls simultaneously.

Subsequent to the work which provided the subject matter disclosed in U.S. patent application, Ser. No. 08/985,771, applicants discovered that the particular fluorine-containing gas used in the second step is critical, not only in determining etch rate, but also with regard to profile control and the accumulation of deposits on the interior surfaces of the process chamber and various processing apparatus enclosed within the chamber. Further, applicants discovered that a single step process is adequate when a particular plasma source gas combination is used.

The present invention pertains to particular etch chemistry which enables silicon etching without mask erosion while providing an etched surface which is free of debris. Using this etch chemistry in combination with processing parameters such as etch chamber pressure, plasma (source) generation power, substrate bias power, and substrate temperature, for example, provides a plasma etch capability meeting silicon deep trench etch requirements. The processing parameters of the kind mentioned above can be provided by equipment known in the art, such as the Silicon Etch DPS (Decoupled Plasma Source) CENTURA® etch system available from Applied Materials, Inc. of Santa Clara, Calif.

SUMMARY OF THE INVENTION

The present invention pertains to an etch chemistry useful for the etching of silicon surfaces. Although the method may be used for applications such as trench isolation and micro machining, it is particularly useful in the deep trench etching of silicon where profile control is particularly important. In the case of deep trench etching, at least a portion of the silicon trench, particularly toward the bottom of the trench, is etched using a combination of reactive gases including fluorine-containing compound which does not contain silicon (FC); a silicon-containing compound (SC), which preferably also contains fluorine; and oxygen ($O_2$). When the SC is a fluorine-containing silicon compound, the volumetric ratio of the FC to SC ranges from about 25:1 to about 1:10, and the volumetric ratio of the $O_2$ to SC ranges from about 10:1 to about 1:10. When the SC is a non-fluorine-containing silicon compound, the volumetric ratio of the FC to SC ranges from about 100:1 to about 1:10, with the volumetric ratio of the $O_2$ to SC ranges from about 10:1 to about 1:10; and, preferably the volumetric ratio of the FC to SC ranges from about 38:1 to about 1:7.

The FC compound may be selected, for example but not by way of limitation, from the following: $F_2O$, $F_2O_2$, $NF_3$, $NOF$, $NO_2F$, $SF_6$, $SF_4$, $S_2F_2$, $S_2F_{10}$, $CF_4$, $CH_2F_2$, $CHF_3$, and $CH_3F$. The most preferred FC is $SF_6$.

When the SC contains fluorine, the SC may be selected, for example but not by way of limitation, from the following: $SiF_4$, $Si_2F_6$, $SiHF_3$, $SiH_2F_2$, $SiH_3F$, $Si_2OF_6$, $SiCl_2F_2$, and $SiClF_3$. The most preferred fluorine-containing SC is $SiF_4$. When the SC does not contain fluorine, the SC may be selected from silicon-containing compounds such as $SiBr_4$, $SiHBr_3$, $SiH_2Br_2$, $SiH_3Br$, $SiCl_4$, $SiHCl_3$, $SiH_2Cl_2$, $SiH_3Cl$, $Si_2Cl_6$, $SiH_4$, $Si_2H_6$, $Si_3H_8$, $Si_4H_{10}$, $SiHI_2$, $SiH_2I$, $C_4H_{12}Si$, and $Si(C_2H_3O_2)_4$, by way of example, and not by way of limitation. The use of a fluorine-containing silicon compound is preferred as a means of improving the etch rate and removing debris from the etched surfaces, while providing supplemental silicon availability for protection (passivation) of the etched mask sidewall and the upper etched portion of the trench, during etching of the bottom portion of the trench. The non-fluorine-containing source of silicon is preferred when the desired trench profile requires additional protection of the etched mask sidewall and the etched surface at the top of the trench during etching the bottom portion of the trench.

Non-reactive diluent gases, typically noble gases such as helium and argon may be used in combination with the reactive gases to assist in etch profile control. The amount of diluent gas used depends on other process variables such as, but not limited to, the desired process pressure, the silicon-comprising substrate temperature, the amount of plasma source power applied to create and maintain the etch plasma, and the amount of bias power applied to the silicon substrate.

Optionally, other reactant halogen-containing gases may be added in limited amounts to further assist in etch profile control. By way of example and not by limitation, bromine-containing compounds such as HBr, $CH_3Br$, $CH_2Br_2$, may be used, wherein the volumetric ratio of FC to the bromine-containing compound ranges from about 100:1 to about 1:100; preferably the volumetric ratio of FC to the bromine-containing compound is about 10:1 to about 1:10. The preferred bromine-containing compound is HBr. It is possible to use chlorine-containing compounds similar to the bromine-containing compounds listed above for profile control, but the bromine-containing compounds are more preferred.

The ratio of FC:SC, combined with the ratio of SC:$O_2$ ensures proper selectivity toward silicon over adjacent layers of material such as silicon dioxide-comprising hard mask material and silicon nitride masking layer, while simultaneously ensuring a rapid etch rate for the silicon.

The etch chemistry described above may be used to deep etch the entire silicon trench. In the alternative, a different etch chemistry, such as those previously known in the art of silicon trench etching, may be used to etch the portion of the silicon trench toward the top of the trench while the new etch chemistry described above is used to etch the bottom portion of the trench. For example, a combination of etchant gases including HBr, $O_2$, and He may be used to etch the upper portion of the trench, where the etch profile is particularly critical, with a combination of etchant gases including $SiF_4$, $SF_6$, $O_2$, and HBr being used to etch the lower portion of the trench. Further, the lower portion of the trench may be etched with $SiF_4$, $SF_6$ and $O_2$ only (without HBr).

Although the etch process is a clean process, particularly when $SF_6$ is used as the primary etchant, it may be desired to use a cleaning step when the process is operated in a deposition mode. A deposition mode takes place when a particularly high concentration of the SC compound is used and/or a particularly high plasma source power (which increases the amount of dissociation) is used, with a result that a silicon-containing material deposits on available surfaces. For the kinds of plasma gas feeds described herein, the silicon-containing material typically comprises silicon, bromine, and oxygen. In the interest of keeping the etch process chamber cleaner, the SC gas flow may be turned off at some time during the etch process, preferably after the etching of the upper portion of the trench and after passivation of the silicon nitride masking layer. More preferably, the SC gas flow is turned off toward the end of the trench etching so that debris is cleaned off the surface of the etched trench as well as off of process chamber walls. In the alternative, the ratio of FC:SC gas may be increased as the etching progresses toward the bottom of the trench.

Using the method of the present invention, including the etch chemistry described above, it is possible to protect pattern masking layers from both lateral erosion and from upper surface etching by operating the etch process under conditions which provide for the deposition of silicon oxide during etch, while simultaneously providing an excellent etch rate for the silicon trench itself. Further, the amount of silicon oxide deposition can be tuned in a manner to obtain the desired profile (physical dimensions) for the deep etched trench.

BRIEF DESCRIPTION OF THE DRAWINGS

FIG. 1 is a schematic illustrating a deep etched 256 Mb DRAM silicon trench structure, including, from top to bottom, a patterning layer of borosilicon glass, a masking layer of silicon nitride, a pad oxide dielectric layer of silicon dioxide, and the ii silicon substrate, with the trench etched through the first three overlying layers and into the silicon substrate. The etch profile shown is that of the preferred, optimized standard.

FIG. 3 is a schematic illustrating a deep etched silicon trench structure including the same layers as described with reference to FIG. 1. The etch profile is representative of that obtained using a two step etch process developed by applicants prior to the present invention.

FIG. 4 is a schematic illustrating a deep etched silicon trench structure including the same layers as described with reference to FIGS. 1 and 3. The etch profile is representative of that obtained using a single step etch process previously known in the art.

FIG. 5 is a schematic illustrating a deep etched silicon trench structure including the same layers as described with reference to FIGS. 1, 2, and 3. The etch profile is representative of that obtained using a single step etch process of the present invention.

DETAILED DESCRIPTION OF THE PREFERRED EMBODIMENTS

Figure 2:
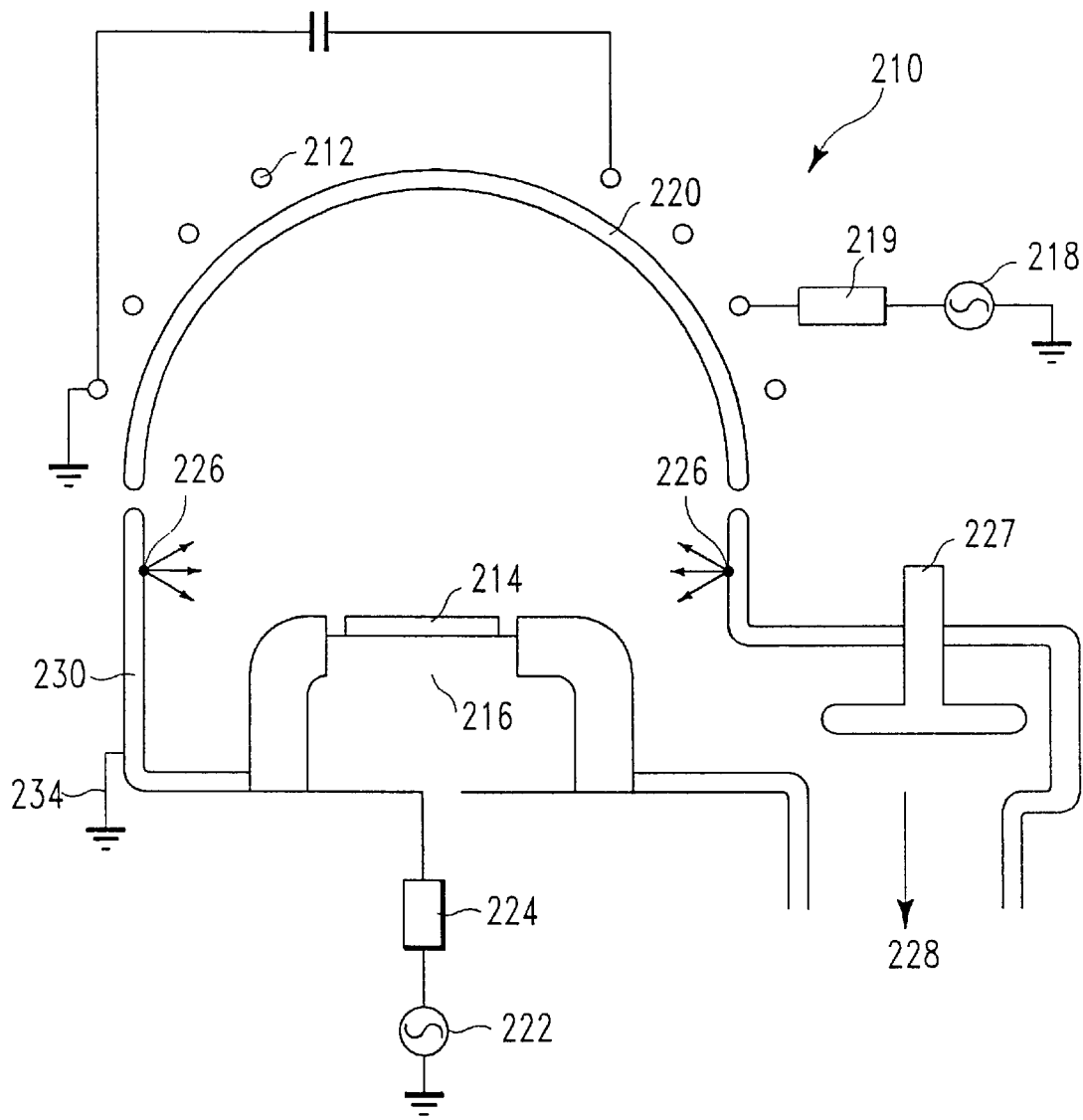
FIG. 2 is a schematic of a plasma processing apparatus of the kind used in carrying out the etching processes described herein.

We have discovered a particular etch chemistry and a method of using that etch chemistry which enables the plasma etching of silicon surfaces, and particularly semiconductor silicon trenches, which reduces or avoids the erosion of the patterned mask through which the trench is etched. At least a portion of the silicon trench, particularly toward the bottom of the trench, is etched using a combination of reactive gases including fluorine-containing compound which does not contain silicon (FC); a silicon-containing compound (SC), which preferably also contains fluorine; and oxygen ($O_2$). When the SC is a fluorine-containing silicon compound, the volumetric ratio of the FC to SC preferably ranges from about 25:1 to about 1:10, and the volumetric ratio of the $O_2$ to SC preferably ranges from about 10:1 to about 1:10. When the SC is a non-fluorine-containing silicon compound, the volumetric ratio of the FC to SC preferably ranges from about 100:1 to about 1:10, and the volumetric ratio of the $O_2$ to SC ranges from about 10:1 to about 1:10; more preferably the ratio of the FC to SC ranges from about 38:1 to about 1:7, with the volumetric ratio of $O_2$ to SC ranging from about 10:1 to about 1:10.

The use of this etch chemistry in combination with other process parameters which can easily be generated on process equipment (such as the Silicon Etch DPS CENTURA® etch system available from Applied Materials, Inc. of Santa Clara, Calif.) enables the formation of variety of different etch profiles in silicon. The etch chemistry is particularly helpful in etching of the difficult to produce deep etched silicon trenches having aspect ratios of 25:1 or greater at feature sizes of 0.15 μm or less and having the desired etch profile which permits easy filling by a material such as polysilicon.

I. Definitions

As a preface to the detailed description, it should be noted that, as used in this specification and the appended claims, the singular forms "a", "an", and "the" include plural referents, unless the context clearly dictates otherwise. Specific terminology of particular importance to the description of the present invention is defined below.

The term "aspect ratio" refers to the ratio of the height dimension to the width dimension of a particular opening, and includes, but is not limited to a trench opening where the cross-sectional profile has an aspect ratio which is the height of the trench divided by the smallest opening (width) dimension.

The term "bias power" typically refers to the power applied to a substrate surface to create a negative voltage (relative to ground) on that surface which is used to control ion bombardment energy and the directionality of ions toward the substrate surface.

The term "decoupled plasma source" refers to a plasma etch apparatus which has separate controls for power input to the plasma source generator and to the substrate bias device. Typically the plasma source controller controls the supply of inductively coupled RF power which determines plasma density (source power) and the bias controller controls the supply of inductively coupled RF power or DC power which is used to generate a bias voltage on the semiconductor substrate surface (bias power). The bias voltage affects the ion bombardment energy on the substrate surface. This decoupled plasma source typically incorporates measures to separate (decouple) the influence of the source and bias on one another. The CENTURA® silicon etch system available from Applied Materials, Inc. of Santa Clara, Calif. which includes decoupled plasma source power and bias power control is referred to as a "DPS" system. Similar equipment available from other manufactures may be referred to by different nomenclature.

The term "etch profile" includes but is not limited to the three dimensional shape of the etched surface (including taper angles). When looking at the cross-sectional view of the etched surface, for example the etched trenches which are illustrated in FIGS. 1 and 3–7 herein, the etch profile typically is referenced to the angle of the taper or to the general shape of the cross-sectional view at a given location from top to bottom of the etched trench.

The term "feature" includes but is not limited to metal lines, trenches and openings in a dielectric layer, and other structures which make up the topography of the substrate surface. Feature size often refers to the size of the smallest feature on the wafer.

The term "ion bombardment" includes but is not limited to the physical collision of ions (and other excited species of atoms which are present with the ions) upon a substrate surface. The ions are accelerated toward the surface by electric fields in the vicinity of the surface exposed to a plasma.

The term "plasma" includes but is not limited to a partially ionized gas containing an approximately equal number of positive and negative charges, as well as some other number of non-ionized gas species.

The term "selectivity" is used to refer to a) a ratio of etch rates of two materials; and b) a condition achieved during etch when etch rate of one material is increased in comparison with another material. Note that there are various kinds of materials included in a stack of layers used in an etching process.

The term "source power" typically refers to the power that is responsible for sustaining the plasma by providing a major portion of the energy to ionize the neutral species in the chamber.

The term "stack" or "etch stack" includes but is not limited to a collection of layers of different materials deposited one over the other, at least a portion of which are etched during an etching process.

The term "taper" includes but is not limited to the gradual diminution of cross-sectional opening of the trench from the top toward the bottom. The taper is typically described in degrees with reference to the horizontal surface at the top of the trench. For example, a 90° angle would provide a vertical sidewall which has essentially zero taper. An angle less than 90° provides a taper. An individual trench may exhibit more than one taper over its length.

II. An Apparatus for Practicing the Invention

The etch process was carrier out in a Silicon Etch DPS (Decoupled Plasma Source) CENTURA ® etch system available from Applied Materials, Inc. of Santa Clara, Calif. A detailed description of a Decoupled Plasma Source of the kind used by applicants was described by Yan Ye et al. at the Proceedings of the Eleventh International Symposium of Plasma Processing, May 7, 1996, and as published in the Electrochemical Society Proceedings, Volume 96–12, pp. 222–233 (1996). The plasma processing chamber enables the processing of an 8 inch (200 mm) diameter silicon substrate surface. The apparatus, having a similar design, is currently being scaled up for application to a 12 inch (300 mm) substrate surface.

A schematic of the processing chamber is shown in FIG. 2 which shows an etching process chamber 210, which is constructed to include at least one inductive coil antenna segment 212, positioned exterior to a dielectric, shaped ceiling 220, and connected to a radio frequency (RF) power generator 218 (which may be a source power generator with a frequency tunable around 12.56 MHZ for impedance matching at different plasma conditions, or which may be a source power generator of fixed frequently which is connected through an impedance matching network 219). Process chamber 210 also includes a substrate 214 support pedestal (cathode) 216 which is connected to an RF frequency power generator 222 (bias power generator of frequency fixed at about 400 kHz) through an impedance matching network 224, and a conductive chamber wall 230 which serves as the electrical ground 234.

The semiconductor substrate 214 is placed on the support pedestal 216 and gaseous components are fed into the process chamber through entry ports 226. A plasma is ignited in process chamber 210 by applying RF powers 218 and 222. Pressure interior to the etch process chamber 210 is controlled using a vacuum pump (not shown) and a throttle valve 227 situated between process chamber 210 and the vacuum pump. The temperature on the surface of the etch chamber walls is controlled using liquid-containing conduits (not shown) which are located in the walls of the etch chamber 210. The temperature of the semiconductor substrate is controlled by stabilizing the temperature of the support pedestal and flowing helium gas in the channels formed by the back of the substrate and grooves (not shown) on the pedestal 216 surface. The helium gas is used to facilitate heat transfer between the substrate and the pedestal. During the etch process, the substrate surface is gradually-heated by the plasma to a steady state temperature which is approximately 30–130° C. higher than the substrate support pedestal temperature, depending on the process conditions. It is estimated that the substrate surface temperature was typically around 70° C. to about 140° C. during most of our experiments. The surface of the etching chamber 210 walls was maintained at about 65° C. using the cooling conduits previously described.

The RF power applied to the inductive coil antenna segment 212 and to the substrate pedestal 216 may be selected to range from about 50 kHz to as high as 13.56 MHZ and may vary in wattage from a few hundred watts to several thousand watts. The power applied to the substrate pedestal 216 may be DC rather than RF alternating current.

For the Examples described below, the frequency of the RF (source) power to the inductive coil antenna segment 212 was 12.56 MHZ, at the wattage specified for the particular example. The frequency of the RF (bias) power to the substrate pedestal 216 was 400 kHz, at the wattage specified for the particular sample.

III. Achieving the Desired Trench Etch Performance

The Optimized, Standard Deep Etch Trench Structure

FIG. 1 illustrates a schematic of a cross-sectional profile of the desired standard for a deep etched silicon trench structure 100 having a particular etch stack overlying the silicon substrate 102. The overlying etch stack includes a borosilicate glass patterning mask 108, a silicon nitride masking layer 106, and a pad oxide dielectric layer 104. Although the present invention has been particularly designed to work with this etch stack, and the Examples which follow are with reference to this etch stack, one skilled in the art can substitute substantially equivalent materials for those specified to make use of the present invention. In the standard etched silicon trench structure 100, the thickness of borosilicate glass patterning mask 108 is 7,000 Å; the thickness of silicon nitride masking layer 106 is 2,200 Å; the thickness of pad oxide dielectric layer 104 is about 80 Å. (FIG. 1 is not to scale.) The top portion 110 of the trench 103, which extends from the silicon surface 105 into the silicon substrate 102 a depth 114 of about 1.5 µm is tapered at an angle of 88.5±0.5°. The bottom portion 112 of the trench 103, which extends beneath the top portion 110 for an additional depth 116 of about 6.5 µm is tapered at an angle of 89.5±0.5°. These angles of taper are highly important in enabling the proper filling of the trench by a subsequently applied dielectric (not shown).

EXAMPLE ONE

The Prior Art Two Step Etch Chemistry and Method

FIG. 3 illustrates a schematic of the cross-sectional profile of a deep etched silicon trench structure 300 obtained by applicants using a two step process of the kind described in U.S. application Ser. No. 08/985,771, assigned to the assignee of the present application.

In particular, the thickness of the borosilicate glass patterning mask 308 after etching of silicon trench 303 was about 2,200 Å; the thickness of silicon nitride masking layer 306 remained at about 2,200 Å; the thickness of pad oxide dielectric layer 304 was about 80 Å. (FIG. 3 is not to scale.) The top portion 310 of the trench 303, which extends from the silicon surface 305 into the silicon substrate 302 a depth 314 of about 1.5 µm is tapered at an angle of 88.7±0.2°. The bottom portion 312 of the trench 303, which extends beneath the top portion 310 for an additional depth 316 of about 5.2 µm is tapered at an angle of 89.7±0.2°. Although the tapers of top portion 310 and bottom portion 312 of trench 303 fall within the specified range of the standard, applicants were able to obtain only a depth 316 of 5.2 µm rather than the desired depth of 6.5 µm. This inability to etch the bottom trench portion 313 to the desired depth was due to the lateral etching of borosilicate glass mask 308 in the area identified on FIG. 3 as 309 and silicon nitride layer 306 in the area identified on FIG. 3 as 311. The lateral etching of these overlying layers, had the etching continued, would have caused the taper of the top portion 310 of trench 303 to deviate from the specified angle range.

The overall etching process used to form the deep etched silicon trench structure 300 described above was as follows. A first etch step was carried out employing a plasma source gas composition of 240 sccm HBr and 41 sccm of a mixture of He and $O_2$, wherein the volumetric ratio of He to $O_2$ was 7:3. The process chamber pressure was 30 mT, the source power was 1800 W, the bias power was 180 W, the substrate support pedestal temperature was 30° C. (with a 16 T He back pressure), and the etch time was 110 seconds. A second etch step was then carried out by transitioning the gas flow composition over about a 10 second period, to a composition of 75 sccm of $SF_6$, 140 sccm of HBr, and 62 sccm of $O_2$. Although the plasma was continued during the transitioning process, the plasma could be shut off during the transitioning if desired. The process chamber pressure was 22 mT, the source power was 700 W, the bias power was 15 W, the substrate support pedestal temperature was 30° C., and the etch time was 360 seconds. During this second etch step, the lateral erosion (as illustrated at 311) of the silicon nitride layer 306 was severe, apparently due to the failure of the silicon from the surface being etched to migrate upward so that a continuing application of silicon dioxide was available to protect the exposed surface of silicon nitride layer 306. The same lateral erosion (as illustrated at 309) occurred with regard to the borosilicate glass layer. Further, the selectivity ratio toward silicon over borosilicate glass was only 14:1, and so a considerable decrease in the thickness of borosilicate masking layer 308 (from 7,000 Å to only 2,200 Å) occurred. The etch rate was about 0.92 $\mu$m per minute and etch uniformity across the trench cross-section, from its center to its edge, varied ±2.4%.

EXAMPLE TWO

The Prior Art Single Step Etch Chemistry and Method

FIG. 4 illustrates a schematic of the cross-sectional profile of a deep etched silicon trench structure 400 obtained by applicants using a single step process of the kind previously known in the art. It was this single step process which was improved upon by applicants in the two step etch process described above in Example One. This example is provided for comparative purposes only.

In particular, the thickness of the borosilicate glass patterning mask 408 after etching of silicon trench 403 was about 1,800 Å; the thickness of silicon nitride masking layer 406 remained at about 2,200 Å; the thickness of pad oxide dielectric layer 404 was about 80 Å. (FIG. 4 is not to scale.) The top portion 410 of the trench 403, which extends from the silicon surface 405 into the silicon substrate 402 a depth 414 of about 1.5 $\mu$m is tapered at an angle of about 88.5±0.2°. As a result of the lateral erosion (as illustrated at 409) of borosilicate glass layer 408, and the lateral erosion (as illustrated at 411) of silicon nitride layer 406, the trench profile, as illustrated at 413, fails to meet the standard requirements for critical dimension 418 control. In particular the initial critical dimension 418 was 0.32 $\mu$m, and during the etch process the critical dimension 418 increased to about 0.53 $\mu$m. In order to maintain the desired critical dimension, the silicon nitride masking layer 406 must not experience lateral erosion which permits an increase in critical dimension 418. Further, the silicon nitride masking layer 406 is used in subsequent processing steps and it is important to maintain this layer intact. The bottom portion 412 of the trench 403, which extends beneath the top portion 410 for an additional depth 416 of about 6.2 $\mu$m is tapered at an angle of 89.5±0.2°.

The overall etching process used to form the deep etched silicon trench structure 400 described above was as follows. A single etch step was carried out employing a plasma source gas composition of 75 sccm $SF_6$, 120 sccm HBr, and 70 sccm $O_2$. The process chamber pressure was 20 mT, the source power was 700 W, the bias power was 18 W, the substrate support pedestal temperature was 15° C. (with a 16 T He back pressure), and the etch time was 350 seconds. During this single step etching process, the lateral erosion (as illustrated at 411) of the silicon nitride layer 406 was severe, apparently due to the failure of the silicon from the surface being etched to migrate upward so that a continuing application of silicon dioxide was available to protect the exposed surface of silicon nitride layer 406. The same lateral erosion (as illustrated at 409) occurred with regard to the borosilicate glass layer 408, as previously mentioned; and, as a result, the etch profile obtained (as illustrated at 413) did not meet specification. Further, the selectivity ratio toward silicon over borosilicate glass was only 15:1, and so a considerable decrease in the thickness of borosilicate masking layer 308 (from 7,000 Å to only 1,200 Å) occurred. The etch rate was about 1.3 $\mu$m per minute, and the etch uniformity was ±1.6%.

EXAMPLE THREE

The Single Step Etch Chemistry and Method of the Present Invention

FIG. 5 illustrates a schematic of the cross-sectional profile of a deep etched silicon trench structure 500 obtained in a single etch step using the etch chemistry and method of the present invention.

In particular, the thickness of the borosilicate glass patterning mask 508 after etching of silicon trench 503 was about 5,600 Å; the thickness of silicon nitride masking layer 506 remained at about 2,200 Å; the thickness of pad oxide dielectric layer 504 was about 80 Å. (FIG. 5 is not to scale.) The top portion 510 of the trench 503, extended from the silicon surface 505 into the silicon substrate 502 a depth 514 of about 1.5 $\mu$m was tapered at an angle of 88.5°±0.5°. The critical dimension 518 was 0.32 $\mu$m, which was maintained during etching because silicon nitride masking layer 506 maintained a constant dimension (as shown on the drawing at 519). The bottom portion 512 of the trench 503, which extended beneath the top portion 510 for an additional depth 516 of about 5.6 $\mu$m was tapered at an angle of 89.5°±0.5°. Prior to the standard buffered HF dip which is carried out after the silicon trench etch process, there was a slight overhang 509 of deposited silicon oxide, deposited during the etch process. The overhang 509 was present in the area of the opening in borosilicate glass patterning mask 508 and on the upper portion of the opening in silicon nitride masking layer 506.

The overall etching process used to form the deep etched silicon trench structure 500 described above was as follows. A single etch step was carried out employing a plasma source gas composition of 30 sccm $SF_6$, 30 sccm $SiF_4$, 50 sccm HBr, and 40 sccm $O_2$. The process chamber pressure was 20 mT, the source power was 1600 W, the bias power was 100 W, the substrate support pedestal temperature was 15° C. (with an 8 T He back pressure), and the etch time was 360 seconds. During this single step etching process, the minimum (if any) lateral erosion (as illustrated at 511) of the silicon nitride layer 511 occurred, due to the availability of additional silicon from the $SiF_4$ in the plasma source gas composition. This additional silicon was sufficient to migrate upward so that a continuing application of silicon dioxide was available to protect the exposed surface of silicon nitride layer 506. A minimum lateral erosion (not shown) occurred with regard to the borosilicate glass layer 508, and with regard to silicon nitride masking layer 506 (as illustrated at 511), and as a result, the etch profile obtained (as illustrated at 513) was well within specification. Further, the selectivity ratio toward silicon over borosilicate glass was improved to about 50:1, so that a minimal decrease in the thickness of borosilicate masking layer 508 (from 7,000 Å to 5,600 Å) occurred. The etch rate was about 1.2 $\mu$m (12,000 Å) per minute, and the etch uniformity was ±1.7%.

From this example one skilled in the art can see that it is possible to protect the masking layers from both lateral erosion and from upper surface etching by operating the etch process under conditions which provide for the deposition of silicon oxide during etch, while simultaneously providing an excellent etch rate for the silicon trench itself. This is a totally surprising result. Numerous previous attempts to develop a process which would protect the masking layers while obtaining an excellent etch rate for the silicon trench itself were not successful. Further, the amount of silicon oxide deposition can be tuned in a manner to obtain the desired profile (physical dimensions) for the deep etched trench.

EXAMPLE FOUR

Figure 6:
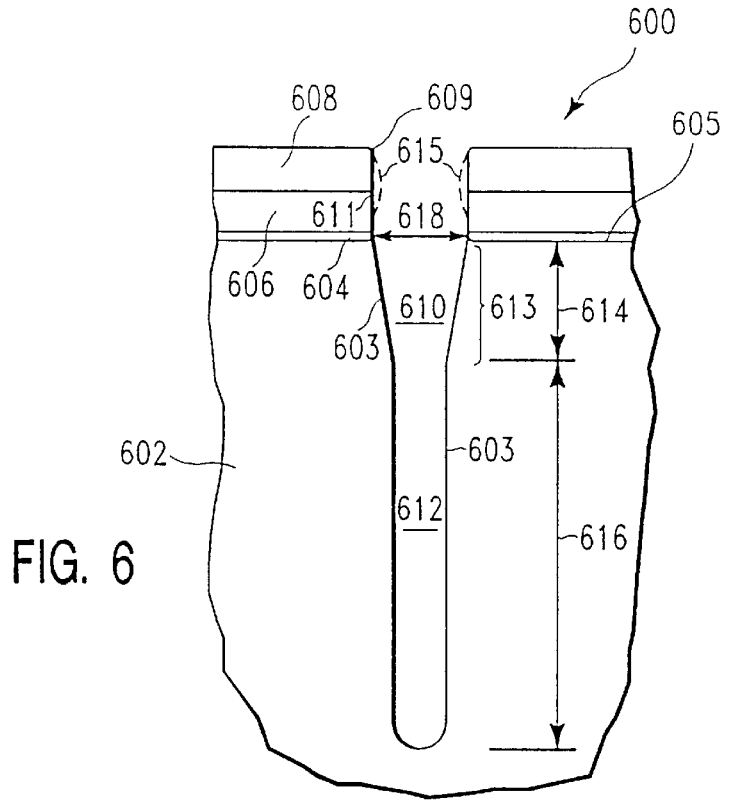
FIG. 6 is a schematic illustrating a deep etched silicon trench structure including the same layers as described with reference to FIGS. 1, 3, 4, and 5. The etch profile is representative of that obtained using a two step etch process, wherein the first step is the same as that used for the two step etch process used to produce the structure shown in FIG. 3, but where the second step etch process is that used to produce the structure shown in FIG. 5.

Use of the First Step Etch Chemistry from the Prior Art and the Method of the Present Invention as the Second Step in a Two Step Process FIG. 6 illustrates a schematic of the cross-sectional profile of a deep etched silicon trench structure 600 obtained by applicants using a two step process of the kind described in U.S. application Ser. No. 08/985,771, but substituting the etch chemistry and method of the present invention for the second step in the two step process.

In particular, the thickness of the borosilicate glass patterning mask 608 after etching of silicon trench 603 was about 5,900 Å; the thickness of silicon nitride masking layer 606 remained at about 2,200 Å; the thickness of pad oxide dielectric layer 604 was about 80 Å. (FIG. 6 is not to scale.) The top portion 610 of the trench 603, which extended from the silicon surface 605 into the silicon substrate 602 a depth 614 of about 1.5 $\mu$m was tapered at an angle of 88.4±0.3°. The critical dimension 618 was about 0.32 $\mu$m. The bottom portion 612 of the trench 603, which extended beneath the top portion 610 for an additional depth 616 of about 6.5 $\mu$m was tapered at an angle of 89.2°±0.2°. The tapers of top portion as illustrated at 613, and bottom portion 612 of trench 603 fell within the specified range of the standard. The slight buildup of a silicon dioxide overhang 615 which prevented the lateral erosion of silicon nitride layer 606 at location 611 and reduced the lateral erosion of patterning mask layer 608 at location 609 was subsequently removed during the standard buffered HF wash/dip.

The overall etching process used to form the deep etched silicon trench structure 600 described above was as follows. The first etch step was carried out employing a plasma source gas composition of 120 sccm HBr and 25 sccm of a mixture of He and $O_2$, wherein the volumetric ratio of He to $O_2$ was 7:3. The process chamber pressure was 30 mT, the source power was 1600 W, the bias power was 190 W, the substrate support pedestal temperature was 15° C. (with a 16 T He back pressure), and the etch time was 110 seconds. The second etch step was carried out without extinguishing the plasma between steps, using a transition process chamber pressure of 25 mT, and a gas flow of 140 sccm of HBr, other variables being held constant. The transition process was also used as a breakthrough step, to remove any silicon dioxide at the bottom of the etched trench prior to proceeding to the second etch step. The transition/breakthrough etch time was 5 seconds at 25 mT. The second etch step was carried out as follows. The plasma source gas composition was 30 sccm of $SF_6$, 30 sccm of $SiF_4$, 50 sccm of HBr, and 38 sccm of $O_2$. The process chamber pressure was 20 mT, the source power was 1,600 W, the bias power was 100 W, the substrate support pedestal temperature was about 15° C. (with the substrate temperature being about 50° C. to about 70° C., depending on process conditions). The etch time was 400 seconds.

An excellent selectivity toward silicon over borosilicate glass of 73:1 was observed on the average over this two step process, as evidenced by the minimal decrease in the thickness of the borosilicate masking layer 608 (from 7,000 Å to 5,900 Å). The etch rate was about 0.91 $\mu$m per minute and etch uniformity across the trench cross-section, from its center to its edge, varied ±2.2%.

EXAMPLE FIVE

Figure 7:
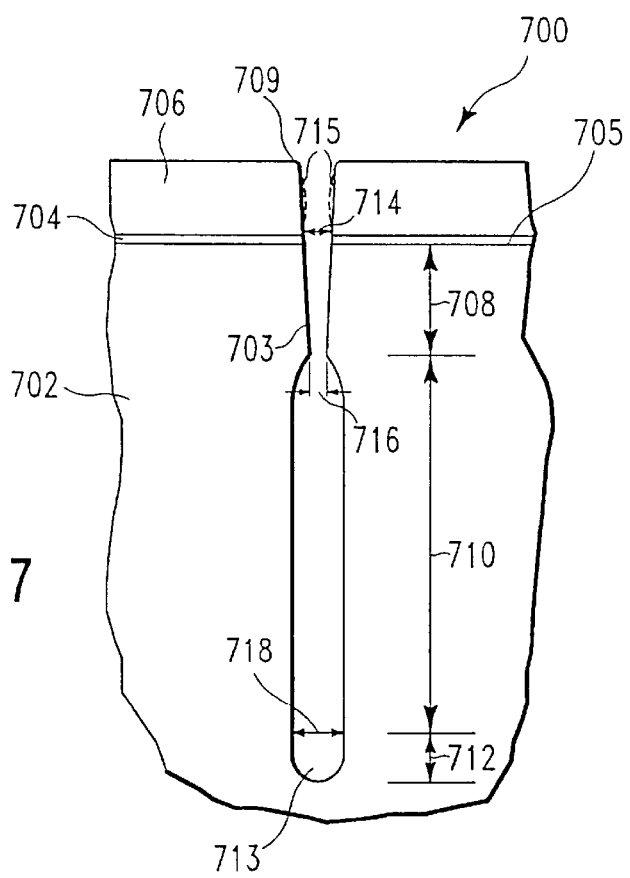
FIG. 7 is a schematic illustrating a deep etched silicon trench structure where the bottom portion of the trench has been enlarged to increase the capacitance as the opening dimension of the upper portion of the trench has been decreased. The trench is representative of that obtained using a two step etch process employing the present invention during the second step etching of the bottom portion of the trench.

Use of a Two Step Etch Chemistry to Produce a Deep Trench Capacitor Having a Minimal Opening Size But Having Increased Capacitance FIG. 7 illustrates a schematic of the cross-sectional profile of a deep etched silicon trench structure 700 obtained using a two step etch including the etch chemistry and method of the present invention. The profile of this deep etched trench structure is referred to as a "bottle" profile because the lower portion of the trench expands out beneath the top, tapered portion of the trench. This profile permits the use of a minimal initial opening size 714 and critical dimension 716, while permitting an enlarged base dimension 718 which permits formation an increased capacitance device or an equal capacitance device having a shorter bottom portion 710. However, this profile can be obtained only when there is strict control of the etch process so that the critical dimension 716 is not closed off. The method of this invention enables such precise etch control.

In particular, a masking layer 706 of BSG having an initial thickness of about 7,000 Å or less was used for pattern development. (We have since discovered that when the method of the present invention is used in the deposition mode, the thickness of BSG may be reduced to about 3,000 Å or less.) Underlying BSG masking layer 706 was a silicon nitride masking layer 704 having an initial thickness of about 2,200 Å. The thickness of pad oxide dielectric layer 707 which covered the surface 705 of silicon substrate 702 was about 80 Å. (FIG. 7 is not to scale.) The top portion of the trench 703, which extended from the silicon surface 705 into the silicon substrate 702 a depth 708 of about 1.8 $\mu$m, was tapered at an angle of 87.7°±0.5°. The bottom portion of the trench 703, which extends beneath the top portion 703 for an additional depth 710 of about 5.1 $\mu$m had a fully extended diameter 718 of about 0.33 $\mu$m. The rounded bottom of the trench 700 extended an additional depth 712 of about 0.5 $\mu$m. The first critical dimension 714 of the trench was about 0.34 $\mu$m; and, the second critical dimension 716 was about 0.22 $\mu$m.

The overall etching process used to form the deep etched silicon trench structure 700 described above was as follows. A first etch step was carried out employing a plasma source gas composition of 120 sccm HBr and 26 sccm of a mixture of He and $O_2$, wherein the volumetric ratio of He to $O_2$ was 7:3. The process chamber pressure was 30 mT, the source power was 1600 W, the bias power was 180 W, the substrate support pedestal temperature was 15° C. (with a 16 T He back pressure), and the etch time was 160 seconds. The second etch step was carried out without extinguishing the plasma between steps, using a transition process chamber pressure of 25 mT, and a gas flow of 140 sccm of HBr, other variables being held constant. The transition process was also used as a breakthrough step, as previously mentioned with regard to other examples. The transition/breakthrough etch time was 5 seconds at 25 mT. The second etch step was carried out as follows. The plasma source gas composition was 30 sccm $SF_6$, 37 sccm $SiF_4$, 60 sccm HBr, and 34 sccm $O_2$. The process chamber pressure was 20 mT, the source power was 1600 W, the bias power was 75 W, the substrate support pedestal temperature was 15° C. (with an 16 T He back pressure), and the etch time was 420 seconds.

During the entire etch process, no lateral erosion of the masking layers occurred, and the BSG masking layer thickness remained relatively constant. The surface of the etch profile was particularly clean, and the first and second critical dimensions, 714 and 716, respectively, were easily maintained.

EXAMPLE SIX

Use of the First Step Etch Chemistry from the Prior Art and the Method of the Present Invention as the Second Step in a Two Step Process to Enable the Etching of Minimal Open Area on a Substrate Surface In plasma etching, the percentage of "open area" typically refers to the percentage of substrate surface which is exposed through the patterning mask. In the case of trench etching, for example, the open area is the substrate surface area which is opened to form the trench. For most DRAM chips, the open area ranges from about 6% to about 16%. However, recently, as chip designers integrate memory and logic onto a single chip, the percentage of open area has decreased drastically, to 0.5% or even less. As the percentage of open area has decreased, the amount of silicon available from the etching process to form the protective sidewall coatings comprising silicon (and typically oxygen and bromine) is diminished. As a result, when large amounts of fluorine are used to obtain the desired etch rate and etched surface characteristics, there is lateral erosion of the masking layers, a problem previously discussed above. This lateral erosion leads to an etch profile which does not meet specification.

We have been able to etch a silicon-comprising substrate having only 0.5% open area, while obtaining the desired etch profile, using the method of the present invention. The additional silicon necessary to protect the masking layer sidewalls from lateral erosion is provided by the SC compound added to the plasma source gas.

In particular, a deep trench was etched using TEOS patterning mask having a thickness of 7,000 Å, overlying a silicon nitride masking layer having a thickness of 2,200 Å, overlying a pad oxide layer of about 80 Å. A two-step process of the kind described above with reference to Example 4 was used.

The first etch step was carried out at a process chamber pressure of 30 mT, using a 15° C. substrate support platen (cathode) temperature and a 16 Torr helium backside pressure. The source power was 1800 W, the substrate bias power was 180 W, and the etch time was 130 sec. The plasma source gas composition was 240 sccm HBr, and 21 sccm of $HeO_2$, with a 7:1 volumetric ratio of $He:O_2$. A transition/breakthrough was used between the two etch steps, without extinction of the plasma. The transition/breakthrough step process chamber pressure was 6 mT; the plasma source power was 1,000 W; the bias power was 200 W; the plasma source gas composition was 20 sccm $SF_6$, 25 sccm HBr, and 10 sccm $O_2$; and, the transition period was 10 seconds. The second etch step process chamber pressure was 20 mT; the plasma source power was 1,400 W; the bias power was 60 W; the plasma source gas composition was,34 sccm $SF_6$, 24 sccm $SiF_4$, 65 sccm HBr, and the sccm of $O_2$ was altered during the etch. The initial sccm of $O_2$ was 32 for 30 seconds, followed by 30 sccm for 150 seconds, followed by 20 sccm for 100 seconds, and followed by 28 sccm for 100 seconds. The reduction in oxygen flow rate as the etch progressed reduced the build-up of silicon oxide-comprising compounds on the etched surface toward the bottom of the trench and enabled the desired trench profile. The depth of the etched trench was 7.0 μm, the average etch rate was 8,000 Å per minute, and the etch rate uniformity was ±0.0% across the substrate surface. The TEOS remaining on the substrate surface after etch was 5,660 Å at the center of an 8 inch (200 mm) diameter wafer, was 5,460 Å midway between the center and the edge, and was 4,640 Å at the edge of the wafer. The taper obtained at the top portion of the trench (during the first etch step) was 89.0° at the wafer, 89.0° midway between the center and the edge, and was 89.3° at the edge of the wafer.

Without the use of the method of the present invention to etch the lower portion of the trench, it would not have been possible to obtain the selectivity for silicon over TEOS necessary to enable etching of the 7 μm deep trench while maintaining the desired profile in the upper portion of the trench.

Debris Removal

The minimal amount of debris on the surface of the deep etched silicon trench was observed for the single step etch process of the present invention as described above with reference to FIG. 5. Use of this plasma etch chemistry also appears to reduce the amount of film build up on process chamber surfaces. Applicants subsequently discovered that it is possible to provide for an even more complete removal of debris from the etched surface, while removing film build up from process chamber walls by turning off the flow of $SiF_4$ gas to the plasma source gas during the last approximately 90 seconds of the trench etching process.

The above description provides numerous specific detail such as material types and process conditions, and such to enable an understanding of the present invention. It will be obvious, however, to one skilled in the art that the present invention may be practiced in other instances using well-known semiconductor manufacturing processes. The above description is not intended to unnecessarily limit the scope of the present invention, which is better illustrated in view of the claims below.

We claim:

1. A method for plasma etching at least a portion of a silicon surface, including the steps of:
   a) selecting a plasma source gas which comprises at least three reactive gases which include at least one fluorine-containing compound which does not contain silicon, at least one silicon-containing compound which does not contain fluorine, and oxygen, wherein a volumetric ratio of said at least one fluorine-containing compound which does not contain silicon to said at least one silicon containing compound which does not contain fluorine ranges from about 100:1 to about 1:10; and
   b) etching said at least a portion of said silicon surface using a plasma generated from said plasma source gas.

2. The method according to claim 1, wherein a volumetric ratio of said oxygen to said silicon-containing compound ranges from about 10:1 to about 1:10.

3. The method according to claim 1, wherein said silicon surface is a deep etched silicon trench and a portion of said silicon trench which is most distant from a silicon surface in contact with a pad oxide layer is etched using said method.

4. The method according to claim 1, or claim 2, wherein said fluorine-containing compound which does not contain silicon is selected from the group consisting of $F_2O$, $F_2O_2$, $NF_3$, $NOF$, $NO_2F$, $SF_6$, $SF_4$, $S_2F_2$, $S_2F_{10}$, $CF_4$, $CH_2F_2$, $CHF_3$, $CH_3F$, and combinations thereof.

5. The method according to claim 1 or claim 2, wherein said silicon-containing compound is selected from the group consisting of $SiBr_4$, $SiHBr_3$, $SiH_2Br_2$, $SiH_3Br$, $SiCl_4$, $SiHCl_3$, $SiH_2Cl_2$, $SiH_3Cl$, $Si_2Cl_6$, $SiH_4$, $Si_2H_6$, $Si_3H_8$, $Si_4H_{10}$, $SiHI_2$, $SiH_2I$, $C_4H_{12}Si$, $Si(C_2H_3O_2)_4$, and combinations thereof.

6. The method according to claim 1, including an additional step c):

cleaning said etched silicon surface using a plasma source gas which comprises at least one halogen-comprising compound, wherein said plasma source gas does not contain a silicon-comprising compound.

7. The method of claim 1, wherein an atomic ratio of fluorine:bromine in said plasma source gas is at least 4:1.

8. The method according to claim 7, wherein said fluorine-containing compound is $SF_6$.

9. The method according to claim 5, wherein said silicon-containing compound is $SiH_4$.

10. The method according to claim 1 or claim 6, wherein a non-reactive diluent gas is used in combination with said reactive gases.

11. The method according to claim 1 or claim 6, wherein a reactive bromine-comprising compound is added to said plasma source gas.

12. The method of claim 6, wherein said halogen-comprising compound is a fluorine-comprising compound.

13. The method according to claim 6 or claim 12, wherein step c) is performed subsequent to step b).

14. A method of plasma etching a silicon trench, including the steps of:

a) etching a first portion of said silicon trench using a first plasma source gas which comprises a halogen-containing, non-silicon-containing compound and oxygen; and b) etching a second portion of said silicon trench using a second plasma source gas which includes at least three reactive gases which include at least one fluorine-containing compound which does not contain silicon, at least one silicon-containing compound which does not contain fluorine, and oxygen, wherein a volumetric ratio of said at least one fluorine-containing compound which does not contain silicon to said at least one silicon containing compound which does not contain fluorine ranges from about 100:1 to about 1:10.

15. The method of claim 1 or claim 14, wherein a volumetric flow of said silicon-containing compound which does not contain fluorine is turned off toward the end of said etching, whereby debris is cleaned off said silicon surface as well as off process chamber walls.

16. The method of claim 1 or claim 14, wherein said volumetric ratio of said at least one fluorine-containing compound which does not contain silicon to said at least one silicon-containing compound which does not contain fluorine is increased as etching progresses, whereby debris is cleaned off said silicon surface as well as off process chamber walls.

17. The method of claim 14, wherein an atomic ratio of fluorine: bromine in said step b) plasma source gas is at least 4:1.

18. The method of claim 14, wherein said step a) halogen-containing compound is HBr.

19. The method of claim 1, or claim 2, or claim 6, or claim 12, or claim 14, or claim 18, wherein a power applied to generate said plasma and a power applied to a substrate comprising a silicon surface to be etched are independently controlled.

20. A method for plasma etching a silicon trench having an aspect ratio of at least 20:1, comprising:

a) etching a first portion of said trench, which is at least 20% of a desired depth of said trench, using a plasma generated from a first plasma source gas including a bromine-containing compound, and subsequently;

b) selecting a second plasma source gas which comprises at least three reactive gases including at least one fluorine-containing compound which does not contain silicon, at least one silicon-containing compound which does not contain fluorine, and oxygen, wherein a volumetric ratio of said at least one fluorine-containing compound which does not contain silicon to said at least one silicon-containing compound which does not contain fluorine ranges from about 100:1 to about 1:10; and c) etching said at least a portion of said silicon surface using a plasma generated from a second source gas.

21. The method of claim 20, wherein said volumetric ratio of said at least one fluorine-containing compound which does not contain silicon to said at least one silicon-containing compound which does not contain fluorine ranges from about 25:1 to about 1:10.

* * * * *